United States Patent
Lin (10) Patent No.: US 9,072,176 B2
(45) Date of Patent: Jun. 30, 2015

(54) ASSEMBLING STRUCTURE OF HEAT DISSIPATION DEVICE

(71) Applicant: ASIA VITAL COMPONENTS CO., LTD., Sinjhuang District, New Taipei (TW)

(72) Inventor: Yuan-Yi Lin, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 112 days.

(21) Appl. No.: 13/904,000

(22) Filed: May 28, 2013

(65) Prior Publication Data
US 2014/0353008 A1    Dec. 4, 2014

(51) Int. Cl.
*H05K 1/02* (2006.01)

(52) U.S. Cl.
CPC .................................... *H05K 1/0203* (2013.01)

(58) Field of Classification Search
CPC ....................................................... H05K 1/0203
USPC ................ 174/252, 548; 361/679.46, 679.54, 361/679.57, 679.58, 688, 704, 709, 710, 361/717, 718, 720
See application file for complete search history.

(56) References Cited

U.S. PATENT DOCUMENTS

| | | | | |
|---|---|---|---|---|
| 6,160,709 A * | 12/2000 | Li | ................................ | 361/704 |
| 6,542,369 B1 * | 4/2003 | Wu | ............................... | 361/704 |
| 8,678,338 B2 * | 3/2014 | Lin | ............................... | 248/609 |
| 2003/0106708 A1 * | 6/2003 | Ma | ................................ | 174/252 |
| 2009/0027858 A1 * | 1/2009 | Lai et al. | ....................... | 361/709 |
| 2011/0249404 A1 * | 10/2011 | Chiu | ............................ | 361/704 |

\* cited by examiner

*Primary Examiner* — Hoa C Nguyen
*Assistant Examiner* — Amol Patel (57) ABSTRACT

An assembling structure of heat dissipation device is applied to a circuit board. A heat generation unit is disposed on one side of the circuit board. The assembling structure of the heat dissipation device includes a heat dissipation unit, at least one latch member and at least one retainer member. The heat dissipation unit is attached to one side of the heat generation unit, which side is distal from the circuit board. At least one latch section outward extends from an edge of the heat dissipation unit. The latch member is fixedly disposed on the circuit board and formed with at least one opening and at least one perforation. The latch section is correspondingly latched in the opening. An elastic member is fitted on the retainer member. The retainer member correspondingly passes through the perforation to fix the latch member on the circuit board.

8 Claims, 10 Drawing Sheets

ASSEMBLING STRUCTURE OF HEAT DISSIPATION DEVICE

BACKGROUND OF THE INVENTION

1. Field of the Invention

1. The present invention relates generally to an assembling structure of heat dissipation device, and more particularly to an assembling structure of heat dissipation device, which can be conveniently uninstalled. Moreover, the latch pressure of the assembling structure can be adjusted in accordance with different pressure requirements.

2. Description of the Related Art

It is known that a microprocessor is disposed on the circuit board of a computer. Thanks to rapid advance of sciences and technologies, the operation speed of the microprocessor has become faster and faster to meet the use requirements. When operating at high speed, the microprocessor inevitably will generate high heat. The heat must be quickly dissipated by means of radiating fin assembly and cooling fan. Otherwise, the microprocessor will be damaged to lose its function.

Figure 1A:
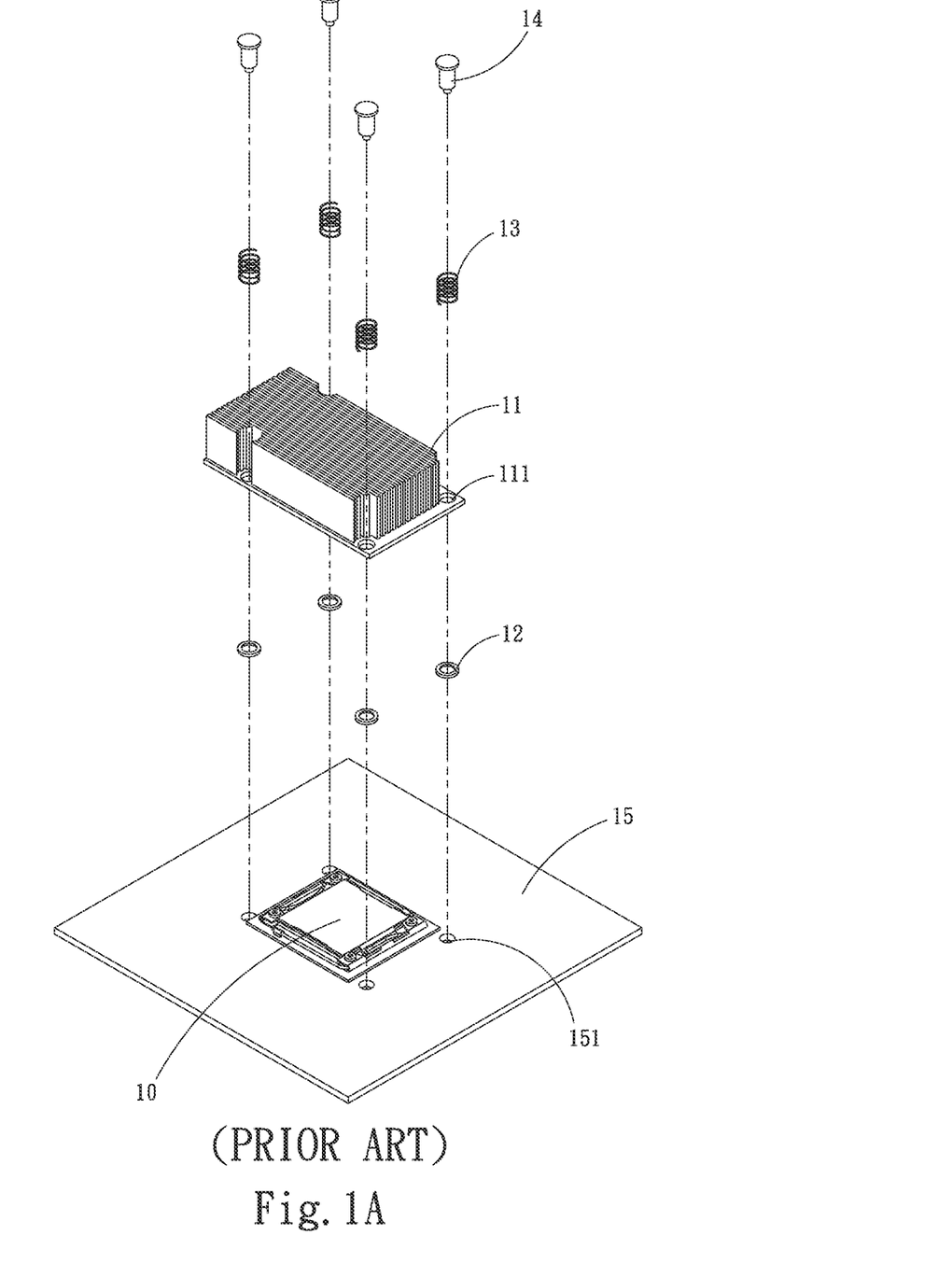
FIG. 1A is a perspective exploded view of a conventional assembling structure of heat dissipation device.
Figure 1B:
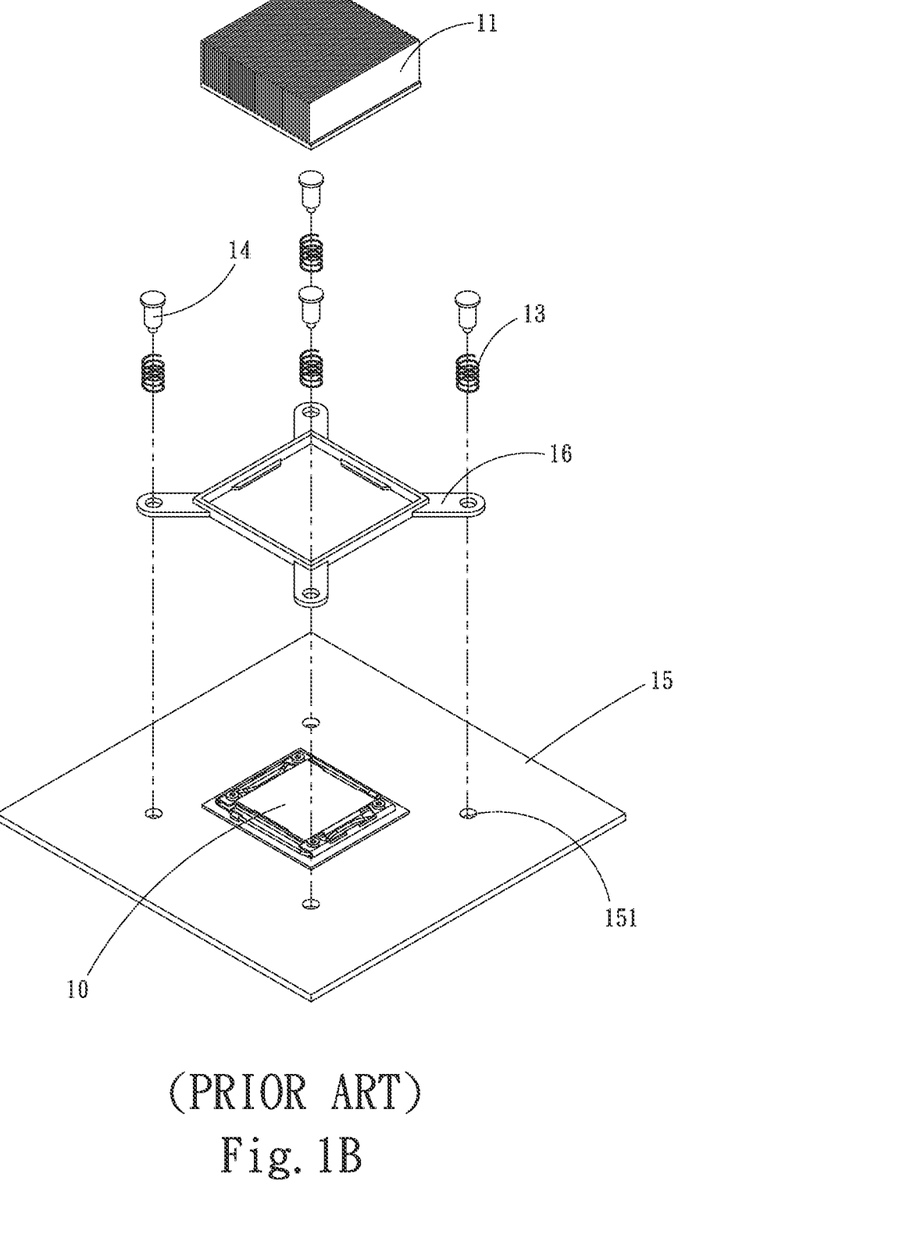
FIG. 1B is a perspective exploded view of another conventional assembling structure of heat dissipation device.

FIG. 1A is a perspective exploded view of a conventional assembling structure of heat dissipation device. A heat dissipation unit 11 is attached to the surface of a heat generation electronic component 10 for dissipating the heat generated by the heat generation electronic component 10. The heat dissipation unit 11 is made of metal material with high thermal conductivity. At least one retainer ring 12 is used to connect the heat dissipation unit 11 with the heat generation electronic component 10 and tightly attach the heat dissipation unit 11 to the surface of the heat generation electronic component 10 so as to enhance heat dissipation efficiency. Also, by means of springs 13 and retainer members 14, the heat dissipation unit 11 is fixed on a circuit board 15. The spring 13 is fitted on the retainer member 14 to form an assembly. The heat dissipation unit 11 is formed with multiple perforations 111. The retainer members 14 pass through the perforations 111 to be fixed in the holes 151 of the circuit board 15 and connected with the retainer rings 12. FIG. 1B shows another conventional assembling structure of heat dissipation device. The assembling structure has a latch member 16. The heat dissipation unit 11 is engaged in the latch member 16. The latch member 16 is securely fixed on the circuit board 15 by means of springs 13 and retainer members 14.

The conventional heat dissipation units in different forms necessitate specific latch members. Therefore, the retainer ring and the latch member are only respectively applicable to specific heat dissipation units. As a result, the cost is increased and the assembling time is prolonged. Moreover, the latch pressure of the conventional retainer ring and latch member cannot be adjusted in accordance with different pressure requirements.

Also, in uninstallation of the heat dissipation unit, it is necessary to use a tool to unlatch the heat dissipation unit from the latch member. This is quite inconvenient.

According to the above, the conventional assembling structure of heat dissipation device has the following shortcomings:
1. It is inconvenient to uninstall the heat dissipation unit.
2. The conventional assembling structure cannot be universally applied to various heat dissipation units.
3. The latch pressure of the conventional assembling structure cannot be adjusted in accordance with different pressure requirements.

SUMMARY OF THE INVENTION

It is therefore a primary object of the present invention to provide an assembling structure of heat dissipation device, which can be conveniently uninstalled.

It is a further object of the present invention to provide the above assembling structure of heat dissipation device, which is more widely applicable to various heat dissipation units.

It is still a further object of the present invention to provide the above assembling structure of heat dissipation device, in which the latch pressure of the latch member can be adjusted in accordance with different pressure requirements.

To achieve the above and other objects, the assembling structure of heat dissipation device of the present invention is applied to a circuit board. A heat generation unit is disposed on one side of the circuit board. The assembling structure of the heat dissipation device includes a heat dissipation unit, at least one latch member and at least one retainer member. The heat dissipation unit is attached to one side of the heat generation unit, which side is distal from the circuit board. At least one latch section outward extends from an edge of the heat dissipation unit. The latch member is fixedly disposed on the circuit board and formed with at least one opening and at least one perforation. The latch section is correspondingly latched in the opening. An elastic member is fitted on the retainer member. The retainer member correspondingly passes through the perforation to fix the latch member on the circuit board.

In the above assembling structure, the retainer member correspondingly passes through the perforation of the latch member to be securely fixed on the circuit board. The outward extending latch section of the heat dissipation unit is correspondingly latched in the opening of the latch member. In uninstallation, a user only needs to outward bias the latch member in a direction away from the heat dissipation unit to easily and directly separate the heat dissipation unit from the heat generation unit and take off the heat dissipation unit. Accordingly, the user can complete the uninstallation without using any tool. Therefore, the uninstallation can be conveniently performed. In addition, the latch member of the present invention is widely applicable to various heat dissipation units so that the cost is saved.

Moreover, the elastic member fitted on the retainer member is extensible/compressible so that the latch pressure can be adjusted through the elastic member in accordance with different pressure requirements.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2A:
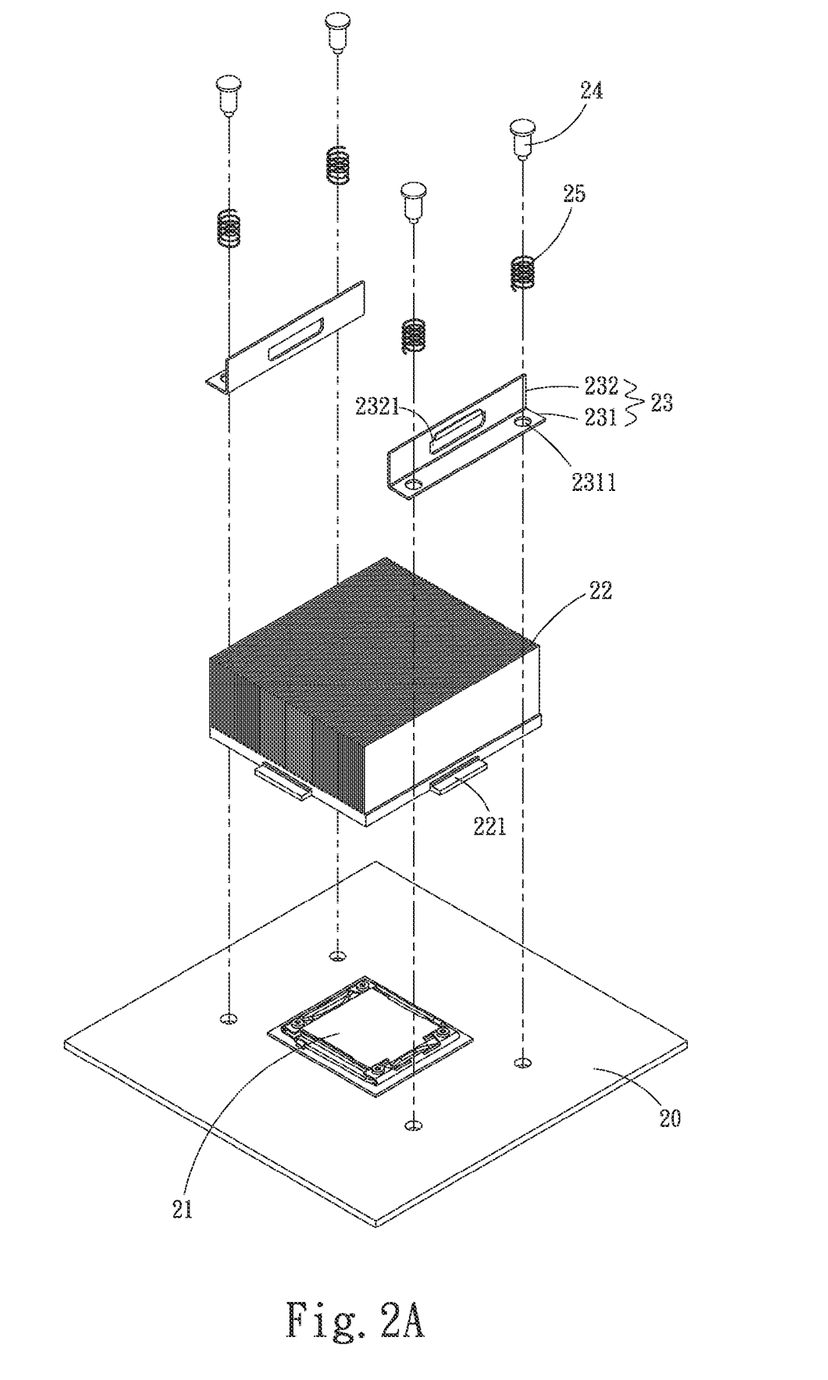
FIG. 2A is a perspective exploded view of a first embodiment of the assembling structure of heat dissipation device of the present invention.
Figure 2B:
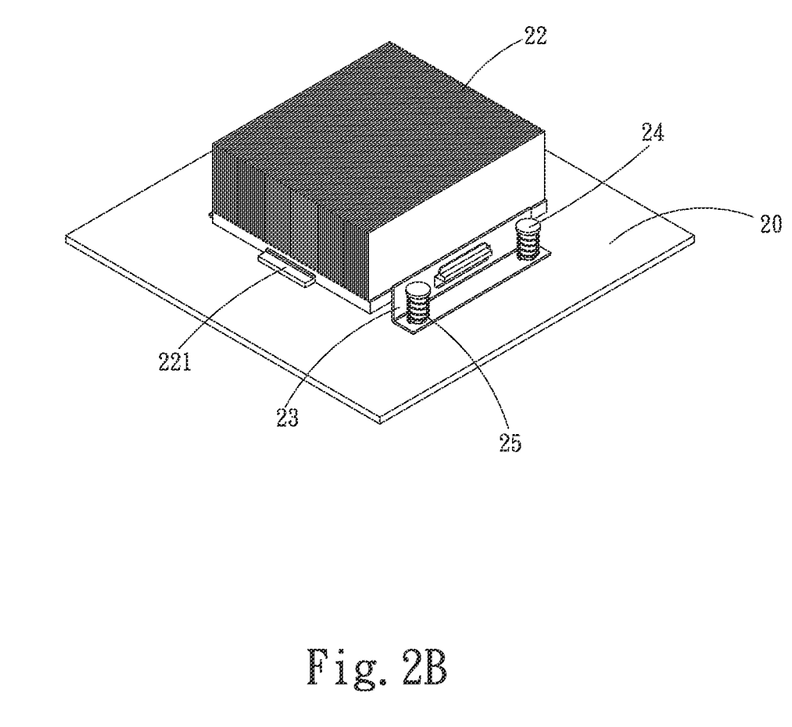
FIG. 2B is a perspective exploded view of the first embodiment of the assembling structure of the heat dissipation device of the present invention.

Please refer to FIGS. 2A and 2B. FIG. 2A is a perspective exploded view of a first embodiment of the assembling structure of heat dissipation device of the present invention. FIG. 2B is a perspective exploded view of the first embodiment of the assembling structure of the heat dissipation device of the present invention. According to the first embodiment, the assembling structure of heat dissipation device of the present invention is applied to a circuit board 20. A heat generation unit 21 is disposed on one side of the circuit board 20. The assembling structure of the heat dissipation device includes a heat dissipation unit 22, at least one latch member 23 and at least one retainer member 24. The heat dissipation unit 22 is attached to the other side of the heat generation unit 21, which side is distal from the circuit board 20. At least one latch section 221 outward extends from an edge of the heat dissipation unit 22. The heat dissipation unit 22 is a heat sink or a radiating fin assembly.

The latch member 23 is fixedly disposed on the circuit board 20. The latch member 23 is formed with at least one opening 2321 and at least one perforation 2311. The latch section 221 is correspondingly latched in the opening 2321. The latch member 23 is made of metal material or nonmetal material. The latch member 23 is L-shaped, having a first latched section 231 and a second latched section 232 perpendicularly connected with the first latched section 231. The perforation 2311 is formed on the first latched section 231 for the retainer member 24 to pass through. The opening 2321 is formed on the second latched section 232 for the latch section 221 to latch with.

An elastic member 25 is fitted on the retainer member 24. The retainer member 24 correspondingly passes through the perforation 2311 to fix the latch member 23 on the circuit board 20. The retainer member 24 is made of metal material or nonmetal material. In this embodiment, the retainer member 24 is, but not limited to, a screw for illustration purposes only. In practice, the retainer member 24 can be any member that can be used to fix the latch member 23 on the circuit board 20, such as a rivet or an insertion pin. The elastic member 25 is made of metal material or nonmetal material. In this embodiment, the elastic member 25 is, but not limited to, a spring for illustration purposes only. In practice, the elastic member 25 can be any member with elasticity, such as a leaf spring, a rubber plate, a silicone plate or an extensible member.

According to the above arrangement, the latch members 23 are correspondingly fixedly disposed on two sides of the heat dissipation unit 22. The second latched section 232 is correspondingly positioned in adjacency to the heat dissipation unit 22.

The retainer member 24 correspondingly passes through the perforation 2311 of the latch member 23 to be securely fixed on the circuit board 20. The outward extending latch section 221 of the heat dissipation unit 22 is correspondingly latched in the opening 2321 of the latch member 23. In uninstallation, a user only needs to outward bias the latch member 23 in a direction away from the heat dissipation unit 22 to easily and directly separate the heat dissipation unit 22 from the heat generation unit 21. Accordingly, the user can complete the uninstallation without using any tool. Therefore, the uninstallation can be conveniently performed. In addition, the latch member 23 of the present invention is widely applicable to various heat dissipation units so that the cost is saved.

Moreover, the elastic member 25 fitted on the retainer member 24 is extensible/compressible so that the latch pressure can be adjusted through the elastic member 25 in accordance with different pressure requirements.

Figure 3:
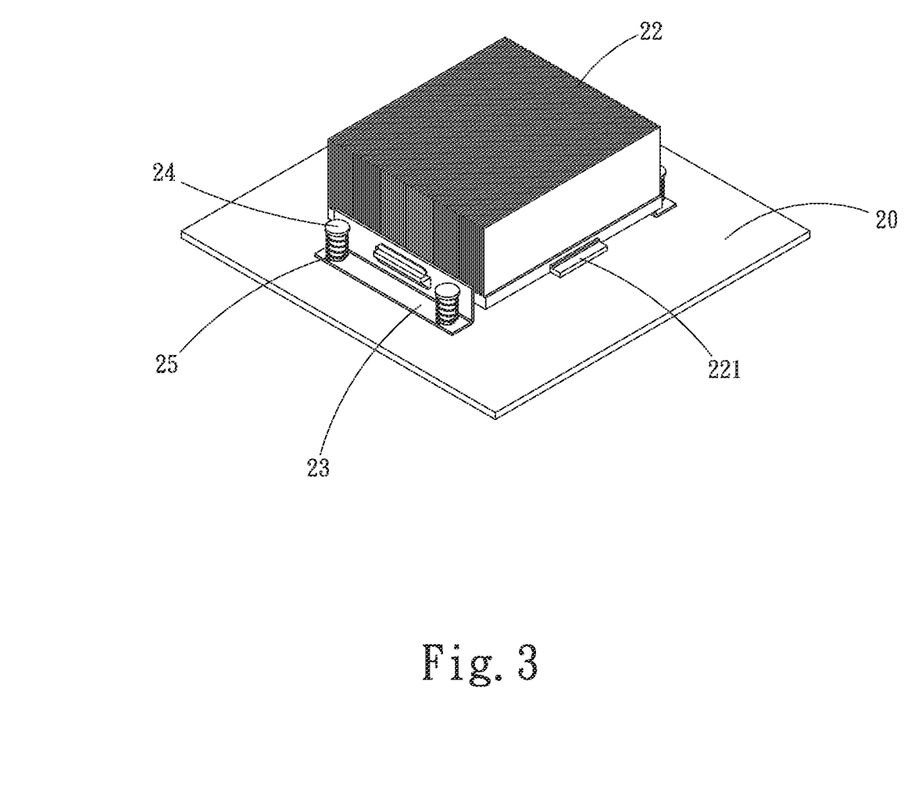
FIG. 3 is a perspective assembled view of a second embodiment of the assembling structure of heat dissipation device of the present invention.

Please now refer to FIG. 3, which is a perspective assembled view of a second embodiment of the assembling structure of heat dissipation device of the present invention. The second embodiment is partially identical to the first embodiment in component and relationship between the components and thus will not be repeatedly described hereinafter. The second embodiment is different from the first embodiment in that the latch members 23 are correspondingly fixedly disposed at two ends of the heat dissipation unit 22. This can achieve the same effect as the first embodiment.

Figure 4A:
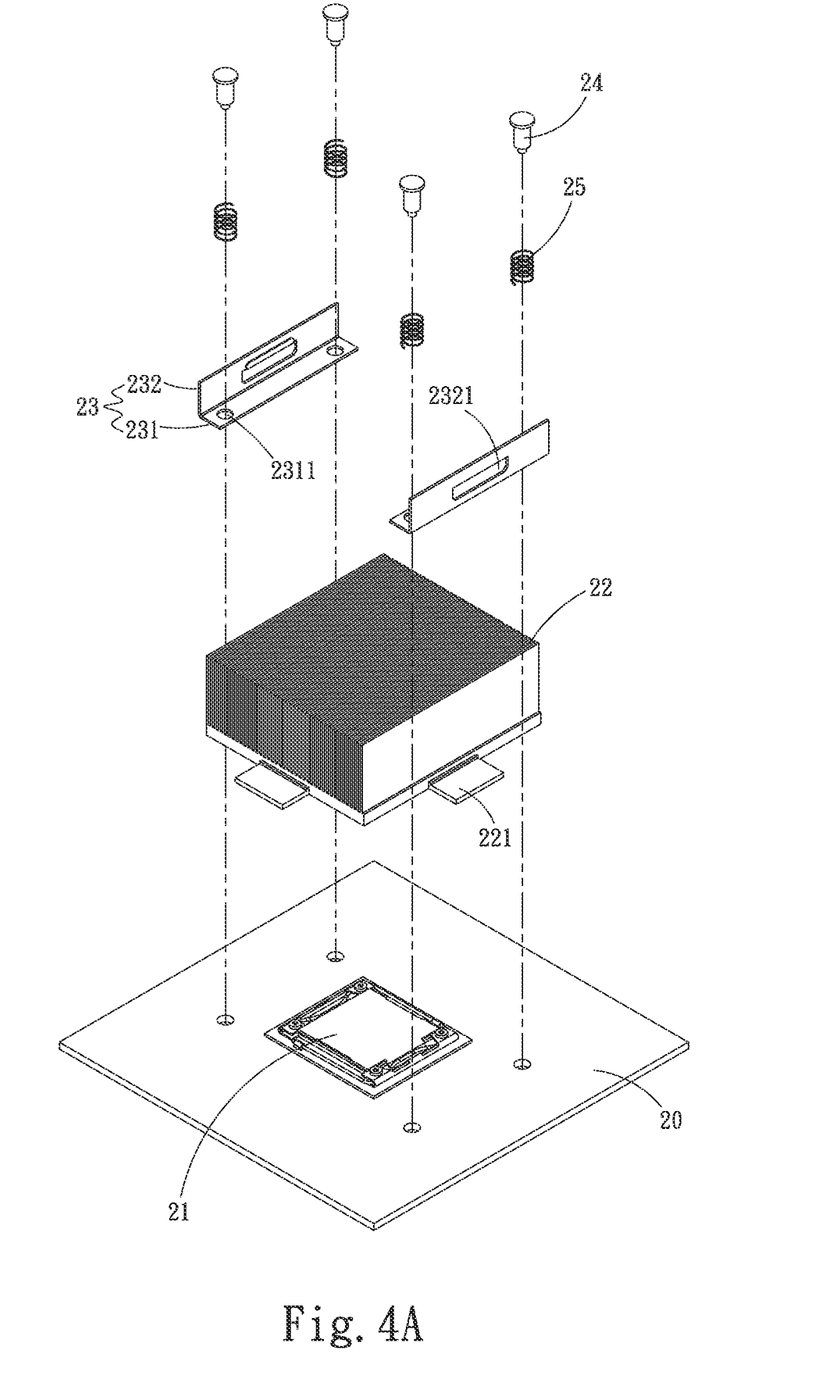
FIG. 4A is a perspective exploded view of a third embodiment of the assembling structure of heat dissipation device of the present invention.
Figure 4B:
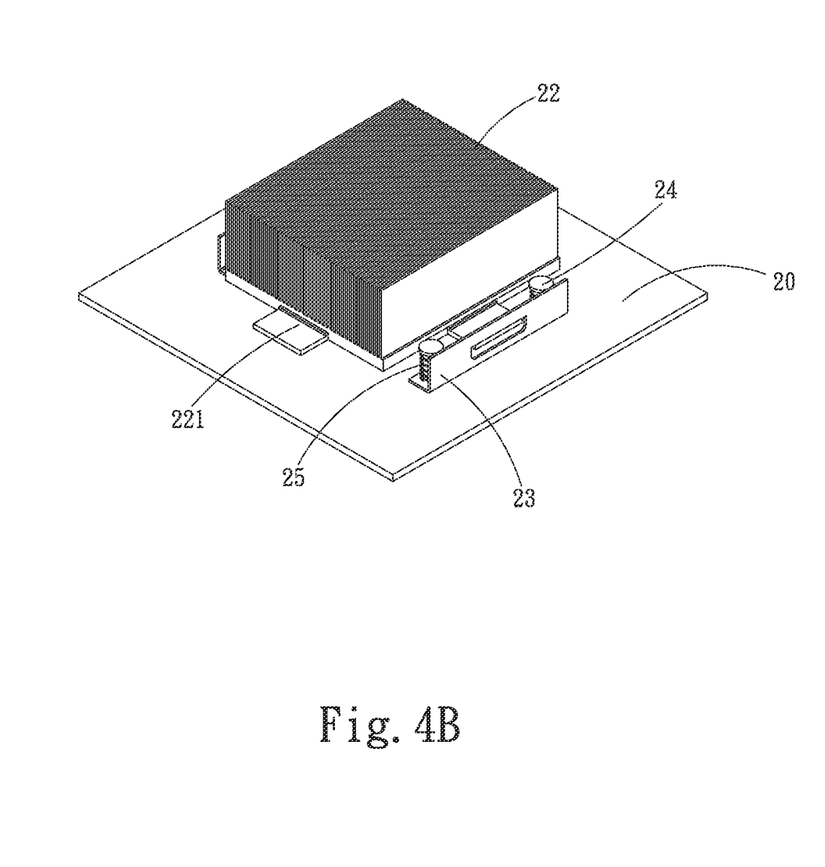
FIG. 4B is a perspective assembled view of the third embodiment of the assembling structure of heat dissipation device of the present invention.

Please now refer to FIGS. 4A and 4B. FIG. 4A is a perspective exploded view of a third embodiment of the assembling structure of heat dissipation device of the present invention. FIG. 4B is a perspective assembled view of the third embodiment of the assembling structure of heat dissipation device of the present invention. The third embodiment is partially identical to the first embodiment in component and relationship between the components and thus will not be repeatedly described hereinafter. The third embodiment is different from the first embodiment in that the latch members 23 are correspondingly fixedly disposed on two sides of the heat dissipation unit 22 with the second latched sections 232 spaced from the heat dissipation unit 22. That is, the latch members 23 are fixed on the circuit board 20 in a direction reverse to that of the first embodiment. This can achieve the same effect as the first embodiment.

Figure 5:
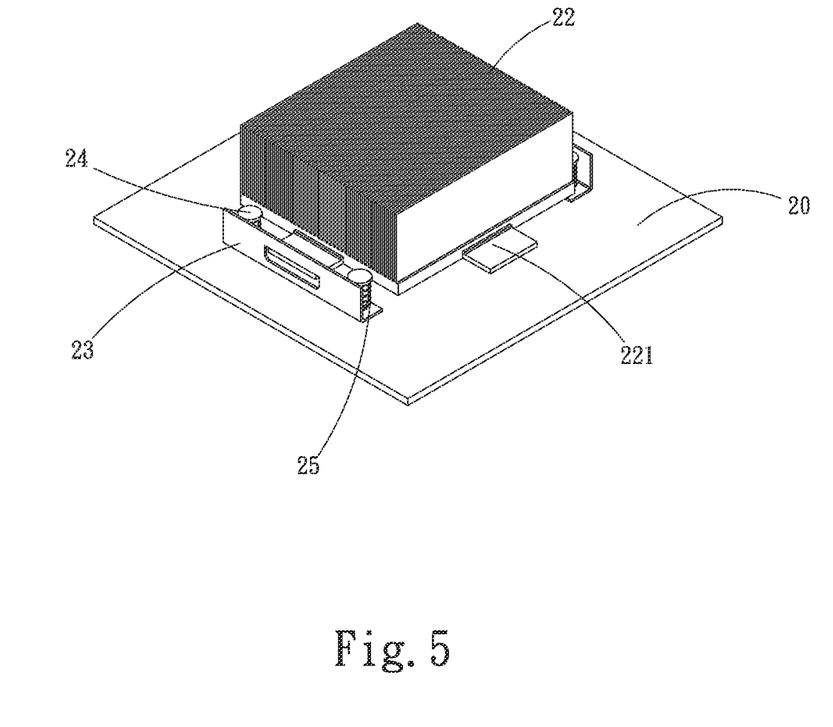
FIG. 5 is a perspective assembled view of a fourth embodiment of the assembling structure of heat dissipation device of the present invention.

Please now refer to FIG. 5, which is a perspective assembled view of a fourth embodiment of the assembling structure of heat dissipation device of the present invention. The fourth embodiment is partially identical to the second embodiment in component and relationship between the components and thus will not be repeatedly described hereinafter. The fourth embodiment is different from the second embodiment in that the latch members 23 are correspondingly fixedly disposed at two sides of the heat dissipation unit 22 with the second latched sections 232 spaced from the heat dissipation unit 22. That is, the latch members 23 are fixed on the circuit board 20 in a direction reverse to that of the second embodiment. This can achieve the same effect as the second embodiment.

Figure 6A:
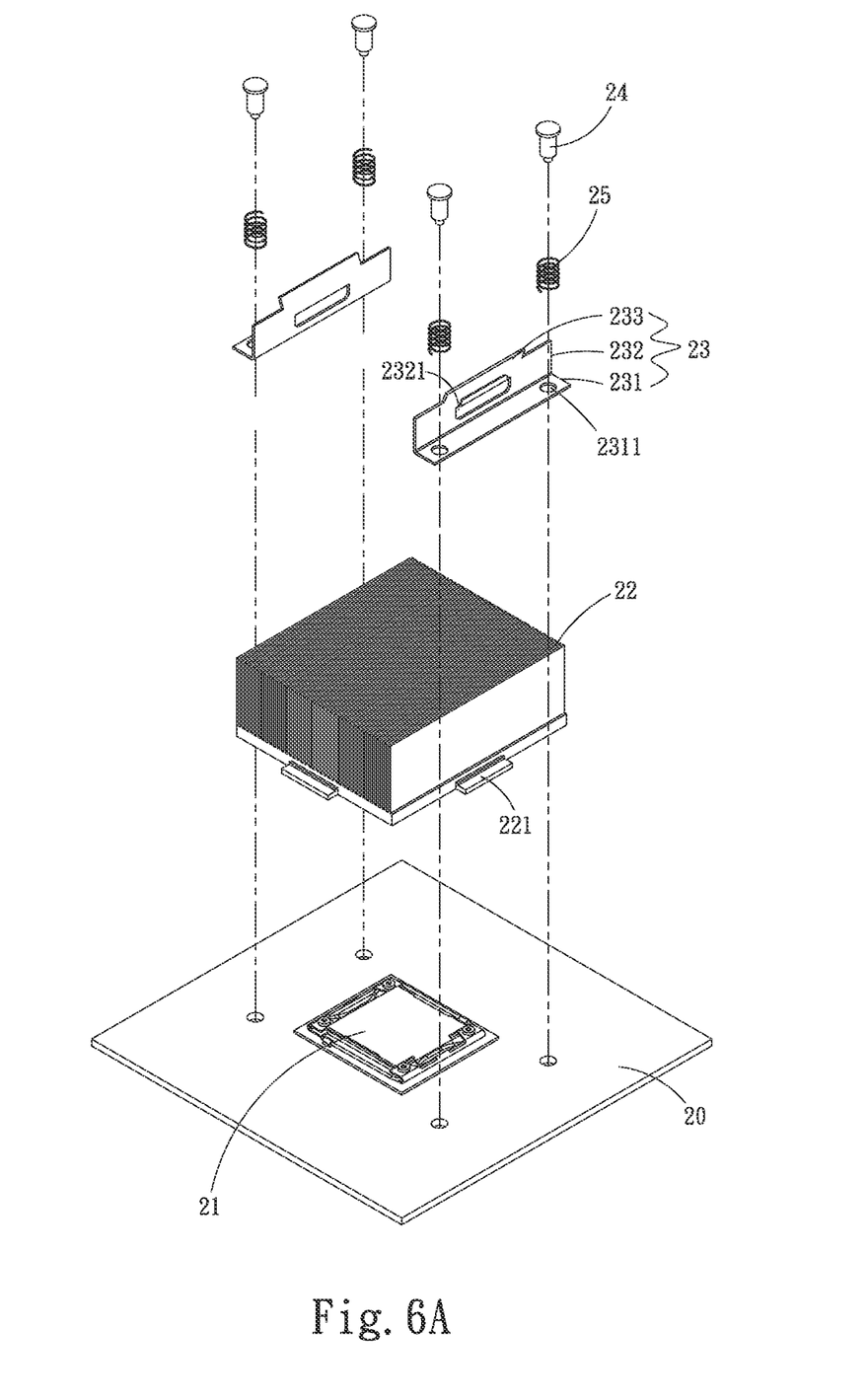
FIG. 6A is a perspective exploded view of a fifth embodiment of the assembling structure of heat dissipation device of the present invention.
Figure 6B:
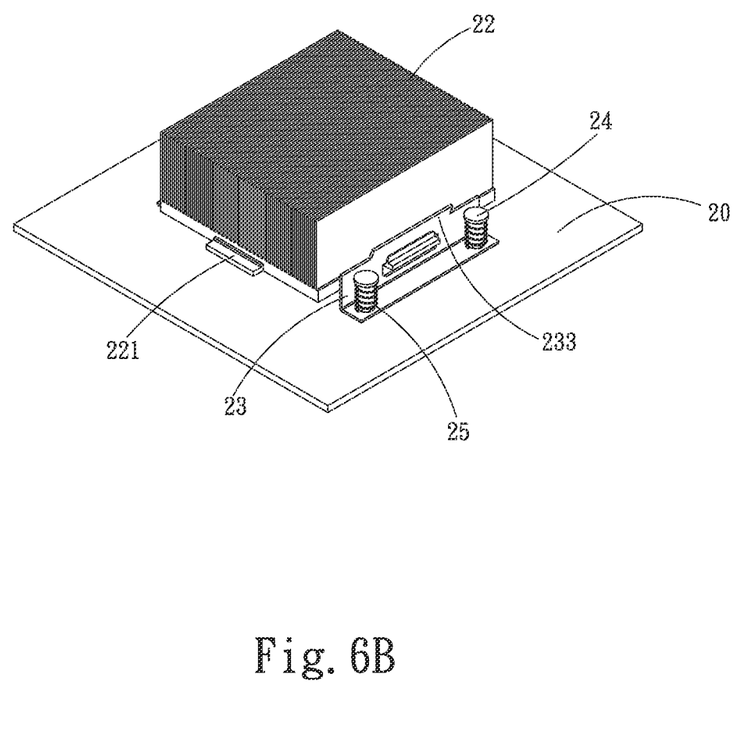
FIG. 6B is a perspective assembled view of the fifth embodiment of the assembling structure of heat dissipation device of the present invention.

Please now refer to FIGS. 6A and 6B. FIG. 6A is a perspective exploded view of a fifth embodiment of the assembling structure of heat dissipation device of the present invention. FIG. 6B is a perspective assembled view of the fifth embodiment of the assembling structure of heat dissipation device of the present invention. The fifth embodiment is partially identical to the first embodiment in component and relationship between the components and thus will not be repeatedly described hereinafter. The fifth embodiment is different from the first embodiment in that the latch member 23 further has an extension section 233 disposed at a free end of the second latched section 232, which end is distal from the first latched section 231. In uninstallation, a user can press the extension section 233 to outward bias the latch member 23 in a direction away from the heat dissipation unit 22 to easily separate the heat dissipation unit 22 from the heat generation unit 21. Accordingly, the extension section 233 facilitates the uninstallation operation.

In conclusion, in comparison with the conventional device, the present invention has the following advantages:
1. The uninstallation operation is facilitated.
2. The present invention is more widely applicable to various heat dissipation units.
3. The latch pressure of the present invention can be adjusted in accordance with different pressure requirements.

The present invention has been described with the above embodiments thereof and it is understood that many changes and modifications in the above embodiments can be carried out without departing from the scope and the spirit of the invention that is intended to be limited only by the appended claims.

What is claimed is:

1. An assembling structure of heat dissipation device, which is applied to a circuit board, a heat generation unit being disposed on one side of the circuit board, the assembling structure of the heat dissipation device comprising:
   a heat dissipation unit attached to the heat generation unit, at least one latch section outward extending from an edge of the heat dissipation unit;
   an L-shaped latch member fixedly disposed on each of two opposite sides of the circuit board heat generating unit, each latch member being formed with at least one opening and at least one perforation, one latch section being correspondingly latched in the opening, each latch member having a first latched section and a second latched section connected with the first latched section, a perforation being formed on the first latched section, said opening being formed on the second latched section for the latch section to latch with;
   at least one retainer member, an elastic member being fitted on the retainer member, the retainer member correspondingly passing through the perforation to fix the latch member on the circuit board; and
   wherein said heat dissipation unit can be removed by simply biasing said latch members in a direction away from the heat dissipation unit to release said latch sections.

2. The assembling structure of heat dissipation device as claimed in claim 1, wherein the heat dissipation unit is a heat sink or a radiating fin assembly.

3. The assembling structure of heat dissipation device as claimed in claim 1, wherein the latch member is made of metal material or nonmetal material.

4. The assembling structure of heat dissipation device as claimed in claim 1, wherein the retainer member is made of metal material or nonmetal material.

5. The assembling structure of heat dissipation device as claimed in claim 4, wherein the retainer member is selected from a group consisting of a screw, a rivet and an insertion pin.

6. The assembling structure of heat dissipation device as claimed in claim 1, wherein the elastic member is made of metal material or nonmetal material.

7. The assembling structure of heat dissipation device as claimed in claim 6, wherein the elastic member is selected from a group consisting of a spring, a leaf spring, a rubber plate, a silicone plate and an extensible member.

8. The assembling structure of heat dissipation device as claimed in claim 1, wherein the latch member further has an extension section disposed at a free end of the second latched section, which end is distal from the first latched section.

* * * * *